United States Patent [19]

Lu et al.

[11] Patent Number: 4,728,623

[45] Date of Patent: Mar. 1, 1988

[54] FABRICATION METHOD FOR FORMING A SELF-ALIGNED CONTACT WINDOW AND CONNECTION IN AN EPITAXIAL LAYER AND DEVICE STRUCTURES EMPLOYING THE METHOD

[75] Inventors: Nicky C. Lu, Yorktown Heights, N.Y.; Brian J. Machesney, Burlington, Vt.

[73] Assignee: International Business Machines Corporation, Armonk, N.Y.

[21] Appl. No.: 915,310

[22] Filed: Oct. 3, 1986

[51] Int. Cl.[4] .............................................. H01L 21/70
[52] U.S. Cl. .................................... 437/52; 357/23.6; 357/55; 156/653; 156/657; 437/60; 437/238; 437/984; 437/89
[58] Field of Search ...................... 29/571, 576 C, 580, 29/577 C, 576 W, 576 E; 357/23.6, 55; 148/DIG. 26; 437/52, 60, 238, 984, 89

[56] References Cited

U.S. PATENT DOCUMENTS

| | | | |
|---|---|---|---|
| 4,327,476 | 5/1982 | Iwai et al. | 29/571 |
| 4,353,086 | 10/1982 | Jaccodine et al. | 357/51 |
| 4,462,847 | 7/1984 | Thompson et al. | 148/174 |
| 4,504,332 | 3/1985 | Shinada | 148/187 |
| 4,522,661 | 6/1985 | Morrison et al. | 148/DIG. 26 |
| 4,578,142 | 3/1986 | Corboy, Jr. et al. | 148/DIG. 26 |
| 4,649,625 | 3/1987 | Lu | 29/577 C |

OTHER PUBLICATIONS

Rom-Choudhury, "Selective Silicon Epitaxy an Orientation Dependence of Growth", J. Electrochem. Soc. May 73, pp. 664–668.

Muench, "Producing Semiconductor Devices by Oriented Over Growth", IBM TDB, vol. 10, No. 10, Mar. 1968.

Dynamic Ram Cell with Merged Drain and Storage IBM TDB, vol. 27, No. 11, Apr. 85, pp. 6694–6696.

Primary Examiner—Brian E. Hearn
Assistant Examiner—Kevin McAndrews
Attorney, Agent, or Firm—John J. Goodwin

[57] ABSTRACT

A fabrication process for providing an epitaxial layer on a silicon substrate and over predefined insulator-capped islands which forms a self-aligned contact window in the epitaxial layer.

Application of the method to a three-dimensional dynamic random access memory (DRAM) device structure is shown, with an access transistor formed in monocrystalline silicon stacked on top of a trench capacitor. A fabrication method therefor is shown wherein the contact window for the source-to-trench connection is formed by self-aligned lateral epitaxial growth, followed by a contact-connection formation step using either a second epitaxial growth or a CVD refill and strapping process. The invention can be further applied to other device structures using the described principles, and more specifically to an inverter structure having the driver device stacked over the load-resistor as another example, which can be used as a basic building circuit unit for logic circuits and static-RAM cell.

11 Claims, 16 Drawing Figures

FABRICATION METHOD FOR FORMING A SELF-ALIGNED CONTACT WINDOW AND CONNECTION IN AN EPITAXIAL LAYER AND DEVICE STRUCTURES EMPLOYING THE METHOD

BACKGROUND OF THE INVENTION

1. Field of the Invention

The present invention relates to a fabrication method wherein an epitaxial layer is formed on a monocrystalline substrate such as silicon and over predefined insulator-capped features such that a self-aligned contact window and subsequent electrical connection can be made to the silicon region capped by the insulator.

2. Description of the Prior Art

The following references are typical of the state of the art of DRAMs with trench capacitors.

U.S. Pat. No. 4,353,086 issued Oct. 5, 1982 to Jaccodine et al entitled SILICON INTEGRATED CIRCUITS describes a dynamic random access memory in which individual cells, including an access transistor and a storage capacitor, are formed in mesas formed on a silicon chip. The access transistor of the cell is formed on the top surface of the mesa and one plate of the storage capacitor of the cell is formed by the sidewall of the mesa and the other plate by doped polycrystalline silicon which fills the grooves surrounding the mesas isolated therefrom by a silicon dioxide layer. By this geometry, large storage surfaces, and so large capacitances, can be obtained for the capacitor without using surface area of the chip. In other embodiments, the mesas may include other forms of circuit elements.

U.S. Pat. No. 4,327,476 issued May 4, 1982 to Iwai et al entitled METHOD OF MANUFACTURING SEMICONDUCTOR DEVICES describes a method which comprises the steps of: forming at least one groove at a given location of a semiconductor substrate; laying an insulating film over the entire surface of the semiconductor substrate including the groove; depositing conductive material on the insulating layer to a thickness greater than half the width of an opening of the groove; and forming a MOS capacitor electrode of the conductor layer left in the groove by etching the deposited conductor layer until the insulating film other than its portion within the groove is exposed.

U.S. Pat. No. 4,462,847 issued July 31, 1984 to Thompson et al entitled FABRICATION OF DIELECTRICALLY ISOLATED MICROELECTRONIC SEMICONDUCTOR CIRCUITS UTILIZING SELECTIVE GROWTH BY LOW PRESSURE VAPOR DEPOSITION describes a method for the fabrication of microelectronic semiconductor circuits, including the concurrent low pressure deposition of monocrystalline and polycrystalline semiconductor material in a predetermined pattern. A dielectric isolated circuit is fabricated, by such selective epitaxial growth, and a subsequent oxidation of both the mono- and polycrystalline deposits. By controlling the ratio of the deposition rates, and by controlling the oxidation step, the poly deposit is substantially fully converted to oxide, while the mono is only partly oxidized, leaving a substantially coplanar, isolated matrix of passivated monocrystalline areas in which to fabricate circuit components for interconnection.

In Japanese Pat. No. 58-137245, a technique is described to increase the area of an electrode without increasing the area of a plane by using the sidewall section of a groove dug into an Si substrate as the electrode surface of a capacitor. A field $SiO_2$ film is formed selectively onto a Si substrate through a LOCOS method, an etched groove is formed into the substrate and a capacitor insulating film made of $Si_3N_4$ is shaped onto these surfaces through a CVD method. The whole surface of the insulating film is coated with a plate represented by polycrystalline Si. A groove is buried with the same polycrystalline Si at the time. The plate is oxidized and a first inter-layer oxide film is formed, the $Si_3N_4$ film and an $SiO_2$ film are removed while using the oxide film as a mask, and a gate oxide film is formed through oxidation. A predetermined section is coated with a word line, and source-drain layers are formed to a section not coated with the plate and the gate through ion implantation, and a second inter-layer insulating film and the electrode are coated selectively.

SUMMARY OF THE INVENTION

An object of the present invention is to provide an improved fabrication process for providing an epitaxial layer on a silicon substrate and over predefined insulator-capped islands which forms a self-aligned contact window in the epitaxial layer.

Another object of the present invention is to provide an improved fabrication process for providing a connection between the device made in the epitaxial layer and the device below the predefined insulator-capped islands and forming a self-aligned contact-connection in the epitaxial layer.

Another object of the present invention is to provide an improved one-transistor dynamic random-access-memory (DRAM) cell structure which has a single-crystal transistor stacked on top of a trench capacitor, and a fabrication method therefor.

Another object of the present invention is to provide a fabrication method for a DRAM device wherein the contact window for the connection between the source region of the access transistor and the storage electrode of the trench capacitor is formed by controlled lateral epitaxial growth to provide a self-aligned contact window.

Another object of the present invention is to provide a fabrication method for a DRAM device wherein the connection between the source region of the access transistor and the storage electrode of the trench capacitor is formed either by using a second-step epitaxial growth to provide a self-aligned contact connection or by using a conductor refill, planarization and strapping process.

Another object of the present invention is to provide a fabrication method for a resistive-load inverter structure wherein the contact window for the connection between the resistor and the driver device is formed by controlled lateral epitaxial growth to provide a self-aligned contact window and followed by a connection formation step using a second epitaxial growth to fill the contact window.

DESCRIPTION OF THE INVENTION

The description of the fabrication method of the present invention is described relative to FIGS. 1 through 16.

Application of the method to a three-dimensional dynamic random access memory (DRAM) device structure is shown, with an access transistor formed in monocrystalline silicon stacked on top of a trench capacitor. A fabrication method therefor is shown wherein the contact window for the source-to-trench connection is formed by self-aligned lateral epitaxial growth, followed by a contact-connection formation step using either a second epitaxial growth or a CVD refill and strapping process. The invention can be further applied to other device structures using the described principles, and more specifically to an inverter structure having the driver device stacked over the load-resistor as another example, which can be used as a basic building circuit unit for logic circuits and static-RAM cell.

Figure 1:
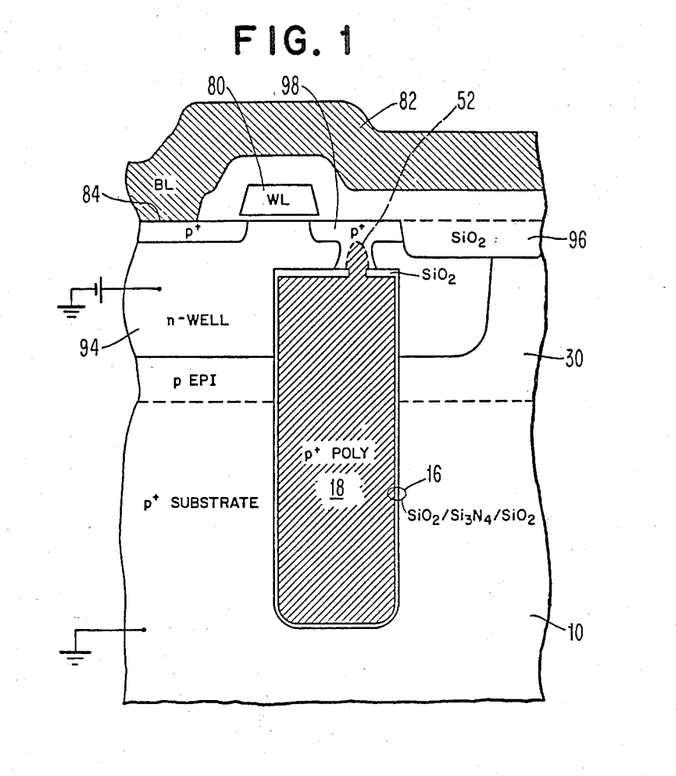
FIG. 1 is a schematic illustration of a cross section of an embodiment of a DRAM cell structure including an epitaxial layer with a self-aligned connection fabricated according to the principles of the present invention.
Figure 2:
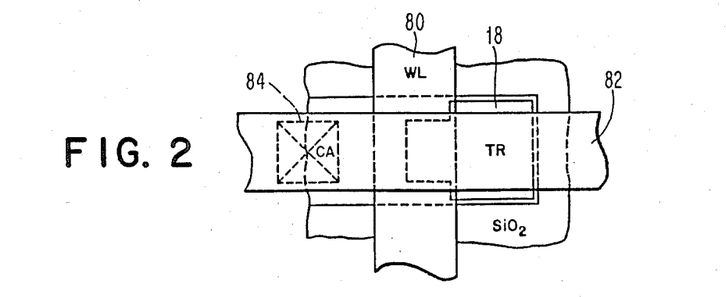
FIG. 2 is a schematic illustration of a top view of an embodiment of the DRAM cell structure which is shown in FIG. 1.

FIG. 1 illustrates a cross-sectional view of a DRAM cell fabricated using the method of the present invention illustrated in FIGS. 3, 4, 5, 6, 7, and 8, with a top view shown in FIG. 2. The structure of the device of FIG. 1 includes a silicon substrate 10 which, for the purposes of explanation, is p+ type. A p-channel transfer device with gate 80, source 98, and drain 84 is made in an n-well region 94 within a p-type epitaxial layer 30. A trench capacitor is located in substrate 10 and filled with heavily doped p+ polysilicon 18. A composite film 16 of SiO$_2$/Si$_3$N$_4$/SiO$_2$ on the trench sidewalls is provided for the capacitor storage insulator. A p+ doped vertical connection 52 is formed to connect the source region of the transfer device and the storage electrode 18 of the trench capacitor. An interconnection 82 used for the bitline is connected to the drain region of the transfer device.

The method steps of one embodiment of the present invention for fabricating the cell structure of FIG. 1 are described as follows.

Figure 3:
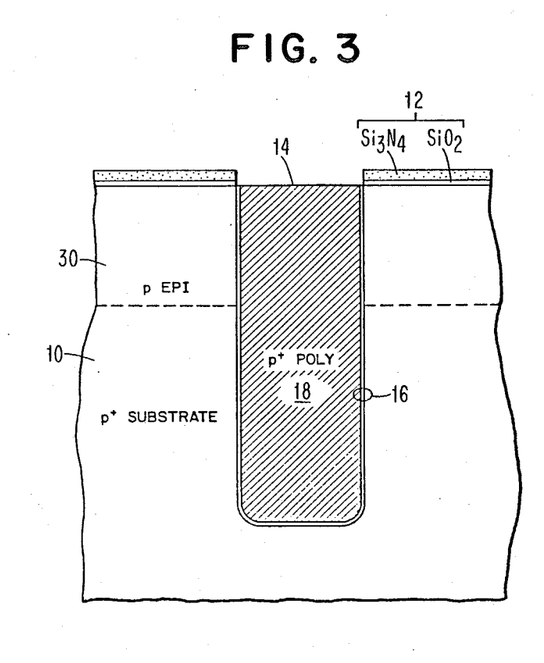
FIG. 3 is a schematic illustration of a cross section of a device being fabricated using the method.

Step 1. A p- doped monocrystalline silicon film 30 is grown epitaxially on p+ doped substrate 10. A composite layer 12 of SiO$_2$ and Si$_3$N$_4$ is formed on epitaxial layer 30. After suitable lithography steps, an opening is made in composite layer 12. The composite layer 12 which remains is then used to mask the etch of a trench into substrate 10 by RIE (reactive ion etching) as shown in FIG. 3.

Step 2. After a thin SiO$_2$ layer is thermally grown on the trench surface, a thin Si$_3$N$_4$ layer is deposited and thermally densified in an oxidizing ambient to form composite film 16, the capacitor storage insulator. A thick, p+ doped polysilicon layer 18 is then deposited to fill the trench as shown in FIG. 3.

Step 3. The polysilicon film 18 is planarized by RIE and/or chemical-mechanical polishing such that the surface of polysilicon 18 is coplanar with the top of substrate 10 as shown in FIG. 3. The nitride/oxide layer 12 over the substrate surface is used for etch stop.

Figure 4:
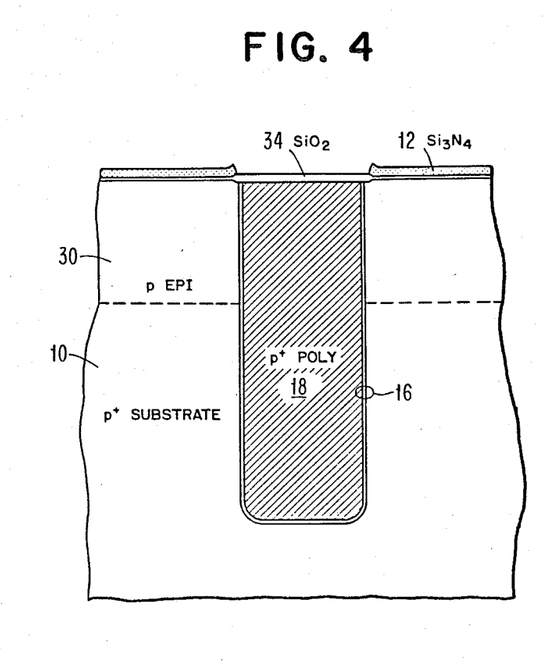
FIG. 4 is a schematic drawing illustrating a further step in the fabrication of a device using the method of the present invention.

Step 4. An SiO$_2$ layer 34 is thermally grown on polysilicon 18. The presence of composite film 12 on the monocrystalline regions prevents oxidation of epitaxial layer 30 as shown in FIG. 4. The thickness of SiO$_2$ layer 34 is much greater than that of the SiO$_2$ portion of composite layer 12.

Step 5. The Si$_3$N$_4$ portion of composite layer 12 is removed by selective isotropic etching. The SiO$_2$ portion of composite layer 12 is then entirely removed, leaving a thickness of SiO$_2$ layer 34 on polysilicon 18 by virtue of its much greater thickness compared to the SiO$_2$ portion of composite layer 12.

Figure 5:
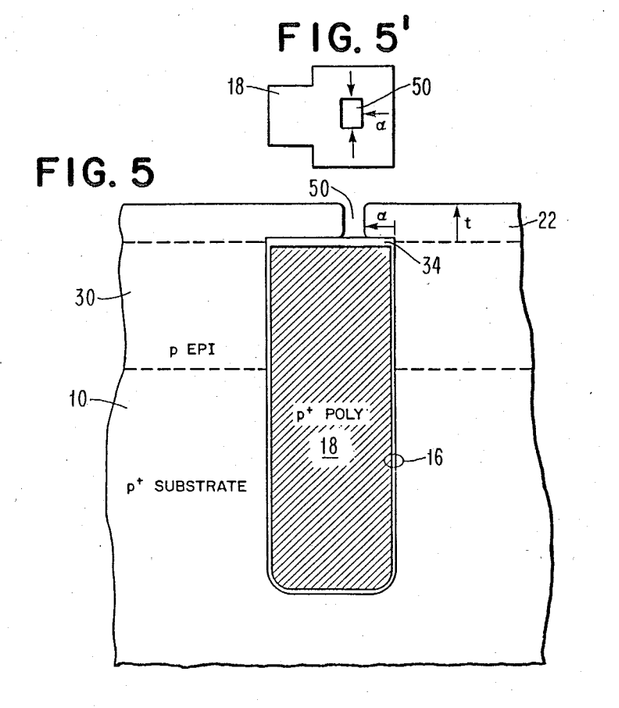
FIGS. 5 to 8 are schematic illustrations of a cross section of a device illustrating additional steps of the fabrication method according to the principles of the present invention.

Step 6. A monocrystalline, p-type doped layer 22 is grown epitaxially on the exposed surface of epitaxial layer 30 as shown in FIG. 5. Epitaxial layer 22 grows laterally over SiO$_2$ layer 34 at approximately the same rate as it grows vertically from epitaxial layer 30. In this way, the growth of epitaxial layer 22 is controlled to produce a lateral "window" 50 between its advancing edges over SiO$_2$ layer 34, illustrated by both top and cross section views.

At this point, a silicon plug of p+ doped silicon can be formed in one of two alternative ways to establish contact to the polysilicon fill 18 of the trench storage capacitor. One technique will be described as Steps 7, 8 and 9; the other technique will be described as Steps 10, 11, 12, 13 and 14.

Figure 6:
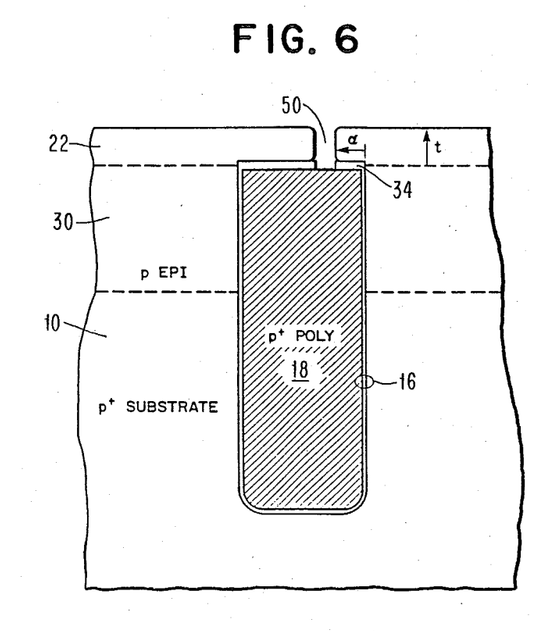

Step 7. Aforesaid window 50 in epitaxial layer 22 is used as a self-aligned mask for removing SiO$_2$ layer 34 over polysilicon 18 in window area 50 by either wet chemical, dry plasma or reactive ion etching, as shown in FIG. 6. Thus, a contact region to the trench fill polysilicon 18 is established by a self-aligned epitaxial growth technique rather than by lithographic masking steps.

Figure 7:
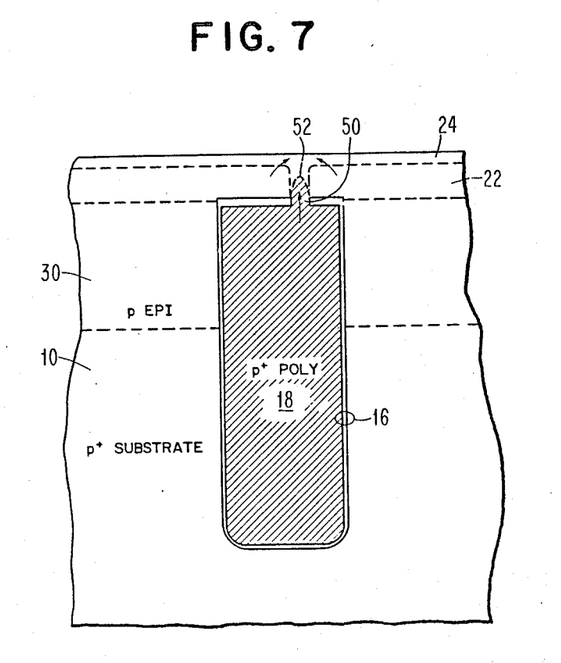

Step 8. After opening the contact region, another epitaxial layer 24 is grown to fill window 50 as shown in FIG. 7. Note that during this growth a pyramidal region 52 of polycrystalline silicon called "neck" results in the window 50 area of polysilicon trench fill 18. Dopant diffusion from polysilicon trench fill 18 into the polycrystalline region 52 of epitaxial layer 24 during this step and subsequent heat treatments forms a conductive region between the polysilicon trench fill 18 and the wafer surface.

Figure 8:
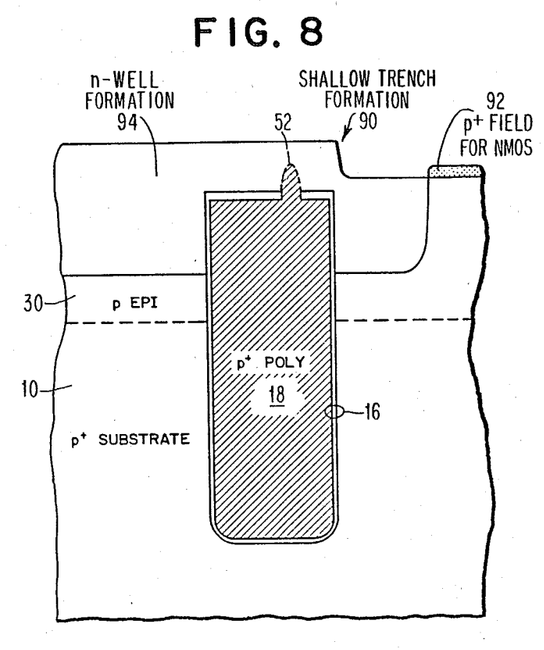

Step 9. Isolation regions and p-channel FET devices are then fabricated in the conventional manner to produce the structure shown in FIG. 1, which is briefly described here. A composite layer of $SiO_2$ and $Si_3N_4$ is formed on the substrate. After suitable lithography steps, an opening is made in the composite layer. The composite layer which remains is then used to mask the etch of a shallow trench 90 into layers 22 and 24 by RIE (reactive ion etching) as shown in FIG. 8. A thin p+ doped glass film 92 is deposited for field isolation of peripheral n-channel devices. A photoresist layer is applied and a mask is used to remove part of the photoresist and the underlying p+ glass layer to expose the regions for n-well formation. Then n-type dopants are implanted through the composite layer of $SiO_2$ and $Si_3N_4$ on the substrate to form n-well 94 regions. Photoresist outside the n-well region blocks the n-type implantation into the n-channel device 92 regions. After the photoresist is removed, a short thermal cycle is used to drive in the p-type dopant into the substrate 30 and the p+ glass layer is removed. A thin thermal oxide is grown over the shallow trench 90 surface, followed by depositing a thick oxide layer to fill the shallow trench and planarization to result in a coplanar surface between the oxide isolation 96 and substrate surface as shown in FIG. 1. Then the composite layer of $SiO_2$ and $Si_3N_4$ is removed. A thin layer of gate oxide is thermally grown with polysilicon gate deposited and defined over it. Form oxide spacer on gate electrode edge, and implant p-type and n-type dopants to obtain the source and drain junctions for p- and n-channel devices, respectively. Open surfaces of polysilicon gates and source/drain regions for subsequent self-aligned silicide formation, deposit blanket CVD glass form and reflow, etch contact holes, and deposit and pattern metal level to complete the cell structure as shown in FIG. 1.

Note that, by virtue of dopant diffusion from polysilicon trench fill 18 into the polycrystalline region of epitaxial layer 52 as described in Step 8 and high diffusivity of the neck 52, conventional formation of the shallow p-type diffusion for the source region of the FET is sufficient to establish an electrical connection between the source region of the FET and polysilicon trench fill 18 without additional lithographic patterning. This feature of the method provides significant advantage for decreasing memory cell area over previously described methods.

Figure 9:
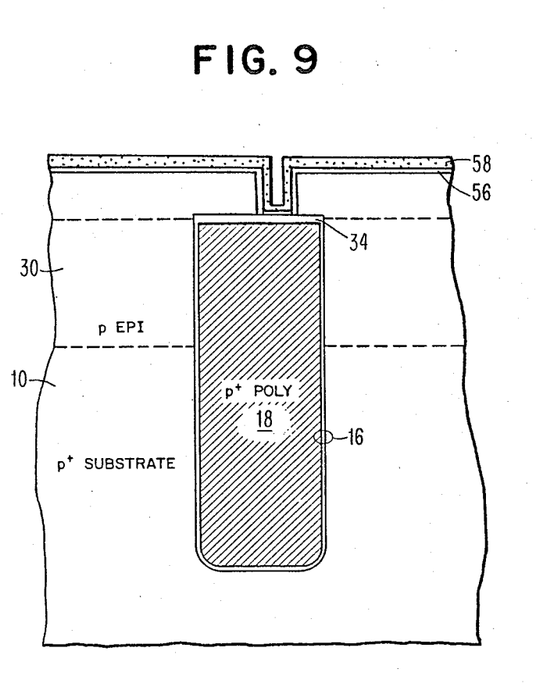
FIGS. 9 to 12 illustrate the fabrication of an alternative structure at various stages in another embodiment of a fabrication process according to the principles of the present invention.

Step 10. The second approach to formation of the conductive plug comprises following the growth of epitaxial layer 22 (Step 6, FIG. 5) with oxidation of layer 22 to form $SiO_2$ layer 56 and by deposition of $Si_3N_4$ layer 58 as shown in FIG. 9.

Figure 10:
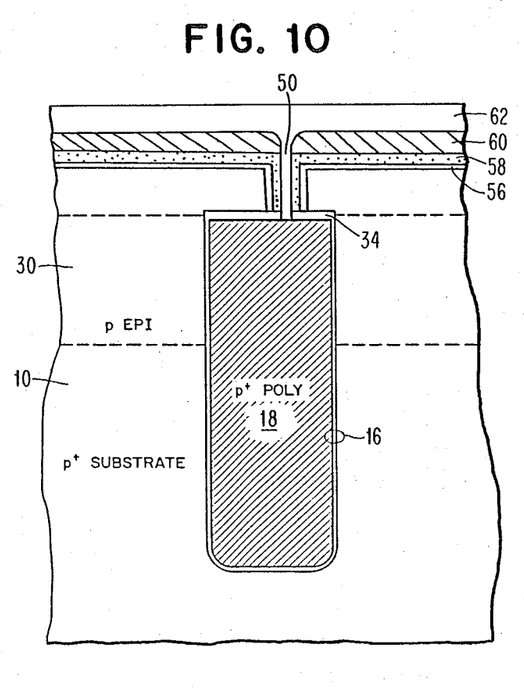

Step 11. Layer 60 of phosphorus-doped n+ polysilicon is deposited on $Si_3N_4$ layer 58 as shown in FIG. 10. With a very narrow contact window 50 as would be employed in VLSI DRAM, n+ polysilicon layer 60 will deposit on the top surface of $Si_3N_4$ layer 58 and just over the corners, but will not deposit on oxidized trench fill polysilicon layer 34 at the bottom of window 50.

Step 12. Using selective and anisotropic RIE, $Si_3N_4$ layer 58, $SiO_2$ layer 56 and oxidized trench fill polysilicon layer 34 are removed from the bottom of window 50 as shown in FIG. 10, using n+ polysilicon layer 60 as a mask. Because of the anisotropic etch, $SiO_2$ layer 56 and $Si_3N_4$ layer 58 remain on the sidewalls of window 50.

Step 13. Deposit intrinsic polysilicon layer 62 to fill window 50 as shown in FIG. 10.

Figure 11:
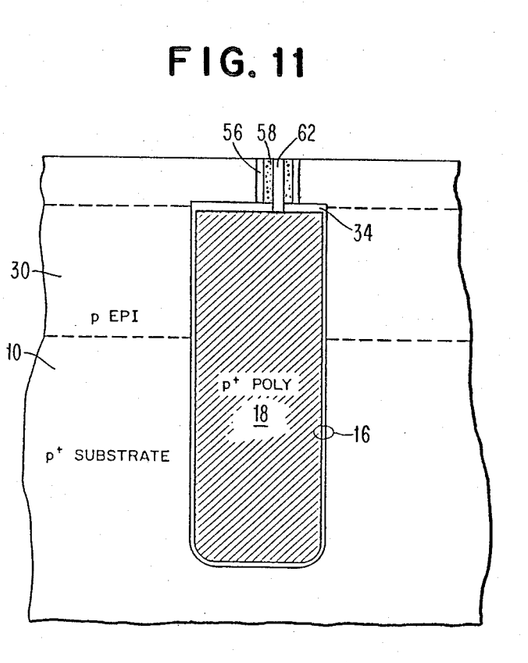
Figure 12:
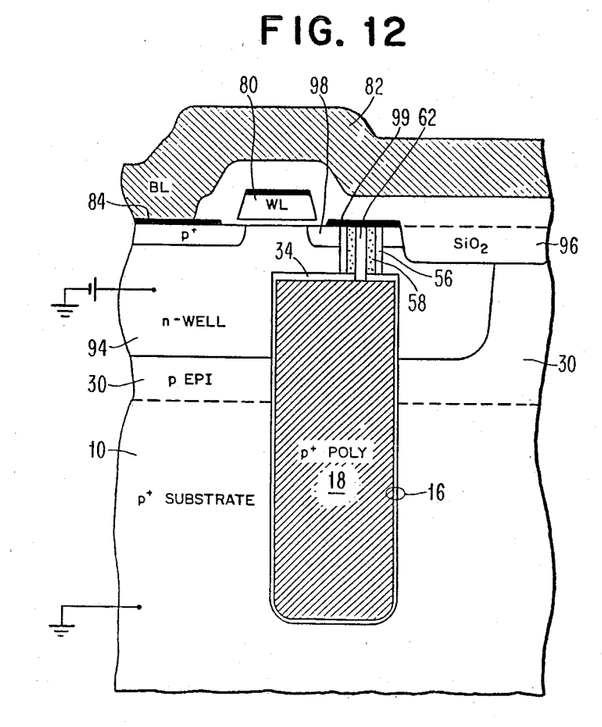

Step 14. Planarize polysilicon layers 62 and 60, stopping on $Si_3N_4$ layer 58, using RIE and/or chemical/mechanical polishing. Remove $Si_3N_4$ layer 58 and $SiO_2$ layer 56 from the top surface of epitaxial layer 22 as shown in FIG. 11. Doping of polysilicon plug layer 60 in window is assured by subsequent thermal processing steps required to complete the DRAM fabrication.

Step 15. Conventional CMOS DRAM processing steps as described in Step 9 are performed to produce the memory cell structure shown in FIG. 12. The self-aligned silicide 90 is continuously formed by deposition and annealing across $SiO_2$ layer 56 and $Si_3N_4$ layer 58 between polysilicon plug layer 60 and the adjacent diffusion of the FET memory transistor to form a self-aligned electrical connection.

The memory cell can be made n-channel without loss of generality by reversing the dopant polarity of polysilicon trench fill 18, forming an p-type "well" region in epitaxial layers 30, 22 and 52, and forming n-channel FET devices in the p-type well.

Figure 13:
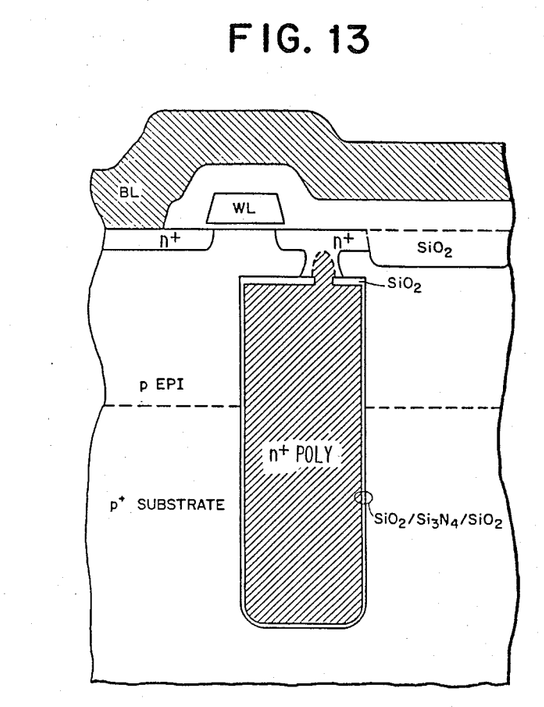
FIG. 13 is a schematic illustration of a cross section of an embodiment of an alternative DRAM cell structure including an epitaxial layer with a self-aligned connection fabricated according to the principles of the present invention.

The memory cell can be made n-channel outside the n-well region without loss of generality as shown in FIG. 13, by reversing the dopant polarity of polysilicon trench fill 18 and forming n-channel FET as transfer devices.

Figure 14:
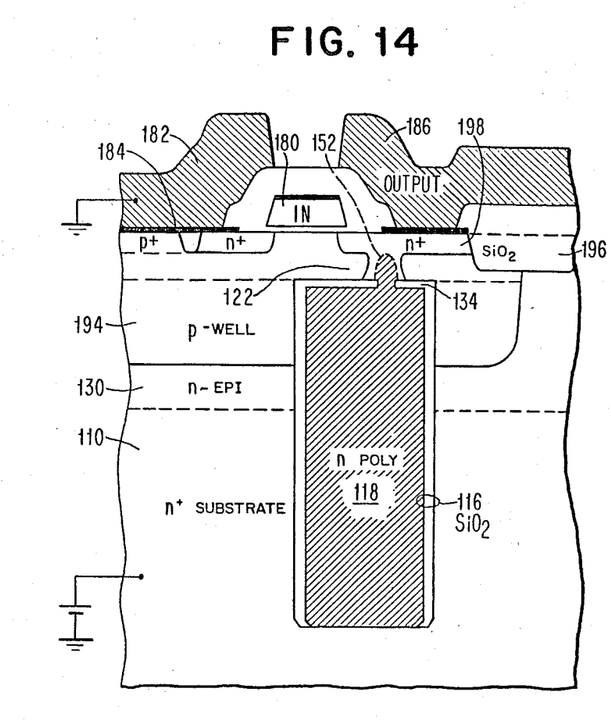
FIG. 14 is a schematic illustration of a cross section of an embodiment of an inverter structure having the driver device stacked over the load-resistor including an epitaxial layer with a self-aligned connection fabricated according to the principles of the present invention.
Figure 15:
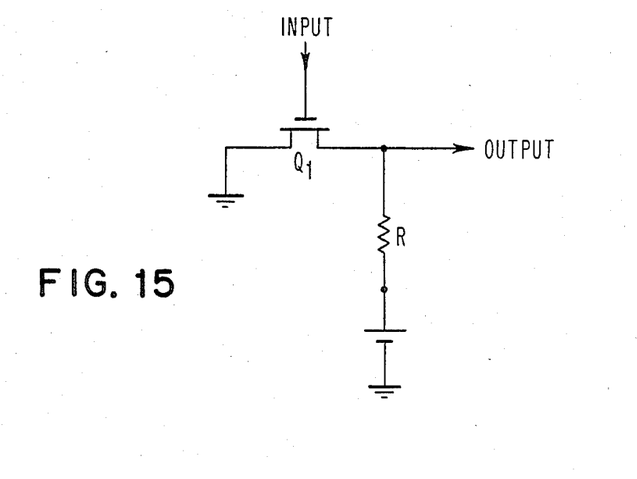
FIG. 15 is a schematic illustration of the equivalent circuit of an embodiment of the inverter structure which is shown in FIG. 14.

FIG. 14 illustrates a cross-sectional view of an inverter using a resistive load fabricated using the method of the present invention, with its equivalent circuit schematic as shown in FIG. 15. The structure of the device of FIG. 14 includes a silicon substrate 110 which, for the purposes of explanation, is n+ type. A n-channel transfer device with gate 180, source 198, and drain 184 is made in a p-well region 194 within a n-type epitaxial layer 130. A trench resistor is located in substrate 110 and filled with n-type doped polysilicon 118 which gives a suitable resistance value. A thick oxide film 116 on the trench sidewalls is provided for the insulator. An n+ doped vertical connection 152 is formed to connect the source region of the driver device and the resistive electrode 118 of the trench resistor. An interconnection 186 connected to the source region of the driver device is used as inverter output and an interconnection 182 which is connected to both the drain region of the driver device and a p+ region employed for applying a bias to the p-well is used for supplying the bias voltage to the inverter, such as ground in FIG. 14. The method steps of one embodiment of the present invention for fabricating the inverter structure of FIG. 14 are described as follows.

Step A1. A n- doped monocrystalline silicon film 130 is grown epitaxially on n+ doped substrate 110. A composite layer of $SiO_2$ and $Si_3N_4$ is formed on epitaxial layer 130. After suitable lithography steps, an opening is made in composite layer. The portion of composite layer 112 which remains is then used to mask the etch of a trench into substrate 110 by RIE (reactive ion etching).

Step A2. A thick $SiO_2$ layer 116 is thermally grown on the trench surface to form an insulator layer. Using selective and anisotropic RIE, only the $SiO_2$ layer at the bottom of trench is removed. Because of the anisotropic etch, $SiO_2$ layer 116 remains on the sidewalls of the trench, while the etch selectivity prevents attack of composite layer 112. A thick, n-type doped polysilicon layer 118 is then deposited to fill the trench. The n-type dopant level is chosen to give the desired resistance for the load device.

Step A3. The polysilicon film 118 is planarized by RIE and/or chemical-mechanical polishing such that the surface of polysilicon 118 is coplanar with the top of epitaxial layer 130. Composite layer 112 over the substrate surface is used as the etch stop.

Step A4. An SiO₂ layer 134 is thermally grown on polysilicon 118. The presence of composite film 112 on the monocrystalline regions prevents oxidation of epitaxial layer 130. The thickness of SiO₂ layer 134 is much greater than that of the SiO₂ portion of composite layer 112.

Step A5. The Si₃N₄ portion of composite layer 112 is removed by selective isotropic etching. The SiO₂ portion of composite layer 112 is then entirely removed, leaving a thickness of SiO₂ layer 134 on polysilicon 118 by virtue of its much greater thickness compared to the SiO₂ portion of composite layer.

Step A6. A monocrystalline, n-type doped layer 122 is grown epitaxially on the exposed surface of epitaxial layer 130. Epitaxial layer 122 grows laterally over SiO₂ layer 134 at approximately the same rate as it grows vertically from epitaxial layer 130. In this way, the growth of epitaxial layer 122 is controlled to produce a lateral "window" between its advancing edges over SiO₂ layer 134.

Step A7. Aforesaid window in epitaxial layer 122 is used as a self-aligned mask for removing SiO₂ layer 134 over polysilicon 118 in window area 150 by either wet chemical, dry plasma or reactive ion etching. Thus, a contact region to the trench fill polysilicon 118 is established by a self-aligned epitaxial growth technique rather than by lithographic masking steps.

Step A8. After opening contact region, another epitaxial layer is grown to fill window. Note that during this growth a pyramidal region 152 of polycrystalline silicon, hereafter referred to as the "neck", results in the window area 150 of polysilicon trench fill 118. Dopant diffusion from polysilicon trench fill 118 into the polycrystalline region of epitaxial layer 152 during this step and subsequent heat treatments forms a conductive region between the polysilicon trench fill 118 and the wafer surface.

Step A9. Isolation regions and n-channel FET devices are then fabricated in the conventional manner as described in Step 9 above with n-type dopant polarity. The complete cell structure as shown in FIG. 14.

Figure 16:
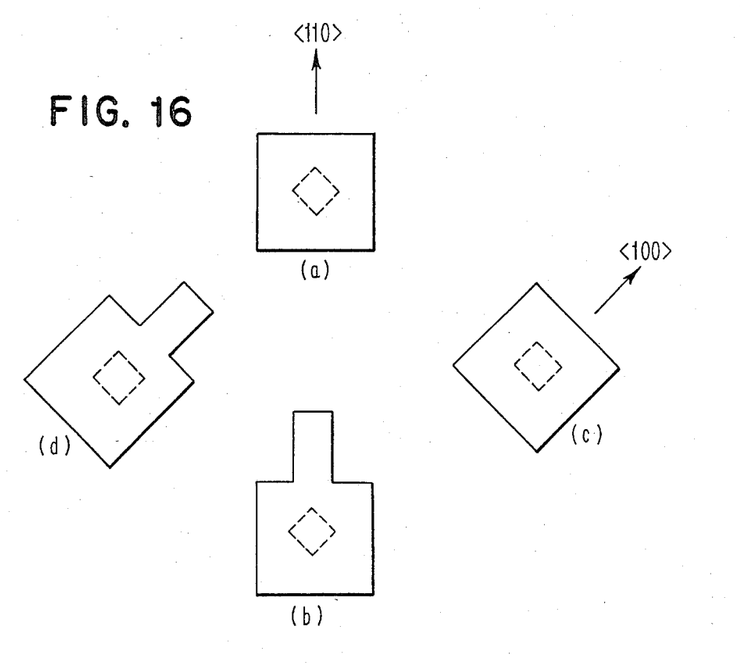
FIG. 16 shows the shape and position of self-aligned contact window on top of the oxide-capped features.

Experimental results show that the shape and position of self-aligned contact window 50 on top of the capped oxide 34 or 134 can be adjusted based on the shape and size of the oxide layer 34 or 134, offering a density advantage for circuit layout. FIG. 16 shows several examples. In FIG. 16(a), the edges of the oxide cap 34 of a rectangular shape are aligned in the <110> direction of a silicon substrate. Contact window 50 is a rectangle rotated 45 degrees with edges oriented mainly along the <100> direction. If a T-shaped oxide cap is designed, the epitaxial layer closes over the narrow portions of the T-shape, producing a window 50 over the widest portion of the T-shape as shown in FIG. 16(b). If the edges of a rectangular oxide cap 34 are aligned in the <100> direction of a silicon substrate, the window 50 can be mainly a rectangle, the directions of whose sides coincide with those of the oxide cap 34 (FIG. 16(c)). Orientation of the major axis of a T-shaped oxide cap 34 along the <100> direction produces a contact window 50 positioned as in FIG. 16(b) but without rotation, as shown in FIG. 16(d). The processing techniques described can be used to form a self-aligned contact window in an epitaxial layer over an oxide-capped device structure. Subsequent formation of a self-aligned connection between the oxide-capped device and the device stacked over it produces a very compact stacked-device structure design. These processing techniques, as applied specifically to a three-dimensional stacked DRAM cell and a stacked inverter structure, provide self-alignment features which reduce fabrication cost and complexity by eliminating lithographic steps. Moreover, control of the lateral growth of epitaxial layers 22 (or 122) and 52 (or 152) with respect to the larger sizes of etched trench features in substrate 10 (or 110) permits the use of unclosed windows in layers 22 (or 122) and, 52 (or 152) over oxidized trench fill polysilicon layers 34 (or 134) as alignment-mark features at succeeding masking levels.

Having thus described our invention, what we claim as new and desire to secure by Letters Patent is:

1. A fabrication method for forming a layer of epitaxial material on a monocrystalline substrate and over a region of insulator layer to produce a self-aligned contact window through the insulator region comprising the steps of:
   A. growing a layer of insulator material on a predetermined region of the surface of a monocrystalline substrate,
   B. growing a layer of epitaxial material on said monocrystalline substrate and laterally over said insulator material region in a direction of growth toward the center of said insulator region,
   C. stopping said growth of said layer of epitaxial material when an exposed region of desired area remains in the center of said insulator material region, the sides of said layer of epitaxial material surrounding said exposed region of insulator material area being a window to said exposed insulator material, and
   D. using said epitaxial layer window as an etching mask for etching away said exposed region of insulator material to produce an opening in said exposed region of insulator material which is aligned with said epitaxial layer window.

2. A fabrication method for forming a layer of epitaxial material on a monocrystalline substrate and over a region of insulator layer to produce a self-aligned contact opening through the insulator region comprising the steps of:
   (A) etching a trench in a monocrystalline substrate,
   (B) filling said trench in said substrate with polysilicon material,
   (C) forming a cap region of insulator material over said polysilicon filled trench,
   (D) growing a layer of epitaxial material on said monocrystalline substrate and laterally over said insulator cap region in a direction of growth toward the center of said insulator cap region,
   (E) stopping said growth of said layer of epitaxial material when an exposed region of desired area remains in the center of said insulator material, and,
   (F) using said epitaxial layer window as an etching mask for etching away said exposed region of insulator material to produce a self-aligned contact opening through said epitaxial material and said insulator material to said polysilicon material in said trench.

3. A fabrication method according to claim 2 wherein said monocrystalline substrate is p-doped and said method includes, after the step A of etching said trench in said substrate, the further steps of
(G) forming a layer of oxide on the surface of said etched trench, and
(H) forming a nitride layer over said oxide layer over said trench surface to form a capacitor storage insulator layer, and
wherein said polysilicon material filled in said trench in step B is p+ doped.

4. A fabrication method according to claim 3 further including the steps of
(I) after forming the contact opening of step F, growing a second layer of epitaxial material over said epitaxial layer grown in step D, said second epitaxial layer filling said window opening in said first epitaxial layer and said insulator cap wherein dopants diffuse from said p+ polysilicon trench material into said epitaxial material in said window opening to form a conductive plug region in said window opening.

5. A fabrication method according to claim 4 further including the steps of
(J) depositing and patterning a masking layer over said second epitaxial layer,
(K) etching a shallow trench in said second epitaxial layer,
(L) depositing and patterning a layer of photoresist material,
(M) defining n-well regions through said photoresist mask,
(N) implanting n-type dopants into said n-well regions,
(O) providing insulation material to obtain device isolation,
(P) growing a layer of gate oxide and depositing and deferring a polysilicon gate thereon,
(Q) implanting dopants to obtain source and drain junctions.

6. A fabrication method for forming a layer of epitaxial material on a monocrystalline substrate and over a region of insulator layer to produce a self-aligned contact opening through the insulator region comprising the steps of:
(A) etching a trench in a monocrystalline substrate,
(B) filling said trench in said substrate with polysilicon material,
(C) forming a cap region of insulator material over said polysilicon filled trench,
(D) growing a layer of epitaxial material on said monocrystalline substrate and laterally over said insulator cap region in a direction of growth toward the center of said insulator cap region,
(E) stopping said growth of said layer of epitaxial material when an exposed region of desired area remains in the center of said insulator material, and,
(F) oxidizing said epitaxial layer to form an oxide on said top and sidewalls of said epitaxial layer and on said exposed region of said insulator material,
(G) depositing a layer of nitride over said oxide layer formed in step F,
(H) depositing a layer of doped polysilicon on the lateral portions of said nitride layer on said epitaxial layer, said polysilicon being not deposited on said nitride covered sidewalls of said epitaxial layer or on said nitride coated oxide layer on said region of insulator material,
(I) using the doped polysilicon layer as an etch mask, etching said nitride, oxide and insulator layers within said sidewalls to produce a self-aligned contact opening through said layers to said polysilicon material in said trench.

7. A fabrication method according to claim 6 wherein said monocrystalline substrate is p-doped and said method includes, after the step A of etching said trench in said substrate, the further steps of
(J) forming a layer of oxide on the surface of said etched trench, and
(K) forming a nitride layer over said oxide layer over said trench surface to form a capacitor storage insulator layer, and
wherein said polysilicon material filled in said trench in step B is p+ doped.

8. A fabrication method according to claim 7 further including the step of
(L) forming a contact plug of polysilicon in said contact opening formed in step I of claim 6.

9. A fabrication method according to claim 8 wherein said step L further includes the steps of
(L-1) depositing a layer of polysilicon over said layer of doped polysilicon of step H and into said contact opening formed in step I of claim 6,
(L-2) removing said polysilicon layer over said layer of doped polysilicon, said layer of doped polysilicon, said nitride layer of step G and said oxide layer of step F to leave a contact plug of polysilicon in said contact opening.

10. A fabrication method according to claim 9 including the further steps of
(M) forming a device isolation region,
(N) depositing and patterning a layer of photoresist material,
(O) defining n-well regions through said photoresist mask,
(P) implanting n-type dopants into said n-well regions,
(Q) growing a layer of gate oxide and depositing and deferring a polysilicon gate thereon,
(R) implanting dopants to obtain source and drain junctions.

11. A fabrication method according to claim 10 including the further step of:
(S) forming conductive layer over source/drain regions which also connects the polysilicon plug in said contact opening in step L-2 of claim 9 to the source region of the access transistor.

* * * * *